US012790718B2

(12) United States Patent
Zuo et al.

(10) Patent No.: US 12,790,718 B2
(45) Date of Patent: Nov. 10, 2026

(54) SINGLE-CRYSTAL DIAMOND AND METHOD OF MANUFACTURING THE SAME

(71) Applicant: SUMITOMO ELECTRIC INDUSTRIES, LTD., Osaka (JP)

(72) Inventors: Yikang Zuo, Osaka (JP); Jin Hwa Lee, Osaka (JP); Yoshiki Nishibayashi, Osaka (JP); Minori Teramoto, Osaka (JP); Yutaka Kobayashi, Osaka (JP); Hitoshi Sumiya, Osaka (JP)

(73) Assignee: SUMITOMO ELECTRIC INDUSTRIES, LTD., Osaka (JP)

(*) Notice: Subject to any disclaimer, the term of this patent is extended or adjusted under 35 U.S.C. 154(b) by 252 days.

(21) Appl. No.: 18/283,788

(22) PCT Filed: Mar. 30, 2022

(86) PCT No.: PCT/JP2022/016171
§ 371 (c)(1),
(2) Date: Sep. 23, 2023

(87) PCT Pub. No.: WO2022/210935
PCT Pub. Date: Oct. 6, 2022

(65) Prior Publication Data

US 2024/0183068 A1 Jun. 6, 2024

(30) Foreign Application Priority Data

Mar. 31, 2021 (JP) ................................ 2021-061208

(51) Int. Cl.
*C30B 29/04* (2006.01)
*C30B 19/00* (2006.01)

(52) U.S. Cl.
CPC .............. *C30B 29/04* (2013.01); *C30B 19/00* (2013.01)

(58) Field of Classification Search
CPC ......... C30B 29/04; C30B 19/00; B01J 3/062; B01J 2203/0655; C01P 2002/70;
(Continued)

(56) References Cited

U.S. PATENT DOCUMENTS 5,908,503 A * 6/1999 Sumiya .................... B01J 3/062 423/446
6,030,595 A 2/2000 Sumiya et al.
(Continued)

FOREIGN PATENT DOCUMENTS

DE 102020109477 A1 1/2021
EP 1712661 A 10/2006
(Continued)

OTHER PUBLICATIONS

Shimaoka et el ., "Detection of Defects in Diamond by Etch-Pit Formation," Phys. Status Solidi A 2019, 216, 1900247 (Year: 2019).*

(Continued)

*Primary Examiner* — Anthony J Zimmer
*Assistant Examiner* — Starfari Teshawn Mcclain
(74) *Attorney, Agent, or Firm* — Renner, Otto, Boisselle & Sklar, LLP

(57) ABSTRACT

A single crystal diamond having a half width of an x-ray diffraction rocking curve of 20 seconds or less, a half width of a peak at a Raman shift of 1332 $cm^{-1}$ to 1333 $cm^{-1}$ (inclusive) in a Raman spectroscopic spectrum of 2.0 $cm^{-1}$ or less, an etch pit density of 10,000/$cm^2$ or less, a content of nitrogen based on number of atoms of 0.0001-0.1 ppm (inclusive), and a content of $^{13}C$ based on number of atoms of 0.01-1.0% (inclusive).

15 Claims, 2 Drawing Sheets

(58) Field of Classification Search
CPC .............. C01P 2002/82; C01P 2006/80; C01P 2006/90; C01B 32/26
See application file for complete search history.

(56) References Cited

U.S. PATENT DOCUMENTS

| | | | |
|---|---|---|---|
| 2007/0036921 A1 | 2/2007 | Twitchen et al. | |
| 2008/0311023 A1* | 12/2008 | Yamamoto | C30B 25/105 423/446 |
| 2014/0077231 A1 | 3/2014 | Twitchen et al. | |

FOREIGN PATENT DOCUMENTS

| | | |
|---|---|---|
| JP | H07-116494 A | 5/1995 |
| JP | H07-148426 A | 6/1995 |
| JP | H09-165295 A | 6/1997 |
| JP | 2005162525 A | 6/2023 |

OTHER PUBLICATIONS

Balasubramanian ("Ultralong spin coherence time in isotopically engineered diamond," 2009) Nature Materials, vol. 8, 383-387 (Year: 2009).*

Acosta ("Diamonds with a high density of nitrogen-vacancy centers for magnetometry applications," 2009) (Year: 2009) Physical Review B 80, 115202-1-115202-15.*

International Search Report for corresponding Application No. PCT/JP2022/016171, mailed May 17, 2022.

Osaka University Knowledge Archive, 2018, https://doi.org/10.18910/69586 non-official translation (Tatsumi, Natuo. Reserch on changing low defect density of high-quality monocrystal diamond devices.) p. 11 (see concurrently cited International Search Report for corresponding Application No. PCT/JP2022/016171, mailed May 17, 2022, for concise explanation of relevance).

Tsurumoto, Kazuya et al., Quantum teleportation-based state transfer of photon polarization into a carbon spin in diamond, Communications Physics, 2019, https://doi.org/10.1038/s42005-019-0158-0, p. 1 schemes 1, 2.

Enkovich, P.V. et al. "Raman Spectroscopy of Isotopically Pure (12C, 13C) and Isotopically Mixed (12.5C) Diamond Single Crystals at Ultrahigh Pressures", Journal of Experimental and Theoretical Physics, 2016, vol. 123, No. 3, pp. 443-451.

Office Action mailed Dec. 4, 2025 in corresponding U.S. Appl. No. 18/283,790.

Office Action mailed May 28, 2026 in corresponding U.S. Appl. No. 18/283,790.

* cited by examiner

SINGLE-CRYSTAL DIAMOND AND METHOD OF MANUFACTURING THE SAME

TECHNICAL FIELD

The present disclosure relates to a single-crystal diamond and a method of manufacturing the single-crystal diamond. The present application claims priority to Japanese Patent Application No. 2021-061208, filed Mar. 31, 2021. The entire contents of this Japanese patent application are incorporated herein by reference.

BACKGROUND ART

Diamonds have been used in various applications, such as heat sinks, wire-drawing dies, precision machining tools, optical components, laser windows, crystals for spectroscopy, monochromators, anvils for ultra-high pressure generators, and semiconductor diamond substrates. Among these applications, in particular, in the fields of optical components, laser windows, crystals for spectroscopy, monochromators, anvils for ultra-high pressure generators, and semiconductor diamond substrates, diamonds with fewer crystal defects and less distortion have been developed to improve performance (for example, Patent Literature 1 to Patent Literature 3).

CITATION LIST

Patent Literature

PTL 1: Japanese Unexamined Patent Application Publication No. 7-116494
PTL 2: Japanese Unexamined Patent Application Publication No. 7-148426
PTL 3: Japanese Unexamined Patent Application Publication No. 9-165295

SUMMARY OF INVENTION

The present disclosure provides a single-crystal diamond having an X-ray diffraction rocking curve with a half-width of 20 seconds or less, wherein the half-width of the X-ray diffraction rocking curve is measured with CuKα radiation in a (004) plane parallel arrangement using a diamond crystal as a first crystal in X-ray diffraction by a double-crystal method, a peak at a Raman shift in the range of 1332 $cm^{-1}$ to 1333 $cm^{-1}$ in a Raman spectrum has a half-width of 2.0 $cm^{-1}$ or less, the single-crystal diamond has an etch-pit density of 10,000/$cm^2$ or less, the etch-pit density is measured in an etching test, the single-crystal diamond has a nitrogen content in the range of 0.0001 ppm to 0.1 ppm based on the number of atoms, and the single-crystal diamond has a $^{13}C$ content in the range of 0.01% to 1.0% based on the number of atoms.

The present disclosure provides a method of manufacturing the single-crystal diamond, the method including:

preparing a seed substrate; and growing a single-crystal diamond on the seed substrate by a high-temperature high-pressure synthesis method, wherein a main surface of the seed substrate has an inscribed circle diameter of more than 1.0 mm, the main surface has an etch-pit density of $1\times10^5$/$cm^2$ or less, and the main surface of the seed substrate has two or less growth sectors.

DESCRIPTION OF EMBODIMENTS

Figure 1:
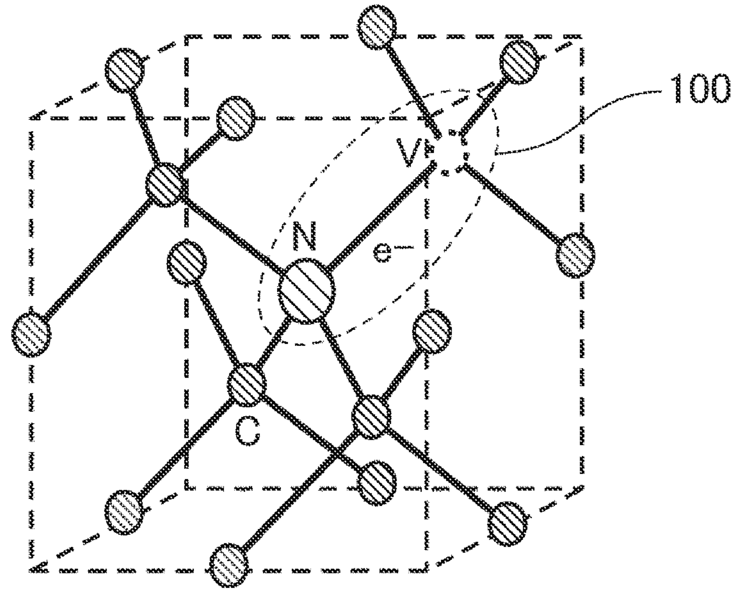
FIG. 1 is an explanatory view of a NV center in a single-crystal diamond.

Problems to be Solved by Present Disclosure

To manufacture a single-crystal diamond with fewer crystal defects and less distortion, it is important to reduce impurities, such as nitrogen, as much as possible, but crystal defects and distortion are difficult to reduce in a single crystal containing much nitrogen. In recent years, while new applications of magnetic sensors and the like have attracted attention, it has been required to reduce crystal defects and distortion in spite of containing nitrogen.

In recent years, an application using a nuclear spin for memory has attracted attention as a new application of diamonds. Examples include quantum repeaters and quantum computers. In this application, despite the addition of nitrogen in a substitutional configuration, further reduction of crystal defects and distortion is desired to improve the memory function and memory stability.

Accordingly, it is an object of the present disclosure to provide a single-crystal diamond that contains nitrogen but has fewer crystal defects and less distortion.

Advantageous Effects of Present Disclosure

The present disclosure can provide a single-crystal diamond that contains nitrogen but has fewer crystal defects and less distortion.

DESCRIPTION OF EMBODIMENTS OF PRESENT DISCLOSURE

First, embodiments of the present disclosure are described below.

(1) The present disclosure provides a single-crystal diamond having an X-ray diffraction rocking curve with a half-width of 20 seconds or less, wherein the half-width of the X-ray diffraction rocking curve is measured with CuKα radiation in a (004) plane parallel arrangement using a diamond crystal as a first crystal in X-ray diffraction by a double-crystal method, a peak at a Raman shift in the range of 1332 $cm^{-1}$ to 1333 $cm^{-1}$ in a Raman spectrum has a half-width of 2.0 $cm^{-1}$ or less, the single-crystal diamond has an etch-pit density of 10,000/$cm^2$ or less, the etch-pit density is measured in an etching test, the single-crystal diamond has a nitrogen content in the range of 0.0001 ppm to 0.1 ppm based on the number of atoms, and the single-crystal diamond has a $^{13}C$ content in the range of 0.01% to 1.0% based on the number of atoms.

A single-crystal diamond according to the present disclosure contains nitrogen but has fewer crystal defects and less distortion. Thus, when the nuclear spin of a single-crystal diamond according to the present disclosure is used for a memory, the memory function and memory stability are improved.

(2) Preferably, the half-width of the X-ray diffraction rocking curve is 10 seconds or less, a peak at a Raman shift in the range of 1332 $cm^{-1}$ to 1333 $cm^{-1}$ in the Raman spectrum has a half-width of 1.9 $cm^{-1}$ or less, the etch-pit density is 1000/$cm^2$ or less, and the number of defects identified in an X-ray topographic image is 1000/$cm^2$ or less.

This further reduces crystal defects and distortion in the single-crystal diamond.

(3) Preferably, the single-crystal diamond has an average of a phase difference per unit thickness of 30 nm/mm or less. This further reduces crystal defects and distortion in the single-crystal diamond.

(4) Preferably, the average of the phase difference is 10 nm/mm or less. This further reduces crystal defects and distortion in the single-crystal diamond.

(5) Preferably, the single-crystal diamond has a NV center and has a NV center content of 0.1 ppm or less. This allows the NV center to exist singly and stably without interfering with each other's spins, interact with a stable atom having nuclear magnetism inside the diamond, and have the memory function.

(6) Preferably, the NV center content ranges from 0.00001 ppm to 0.1 ppm. This allows an isolated stable single NV center to be found and detected in the diamond and interact with a stable atom having nuclear magnetism in the diamond, and allows a single-crystal diamond to have the memory function.

(7) Preferably, the single-crystal diamond has a boron content based on the number of atoms equal to or lower than the nitrogen content based on the number of atoms. This allows a NV center to exist and further reduces the distortion of the single-crystal diamond.

(8) Preferably, the boron content based on the number of atoms is 10% or less of the nitrogen content based on the number of atoms. Boron can be a site for trapping an electron, reduce the number of trapping sites below a certain value, and efficiently generate a NV center with an information input/output function to a memory atom.

(9) Preferably, the boron content based on the number of atoms is more than 10% of the nitrogen content based on the number of atoms and is equal to or lower than the nitrogen content based on the number of atoms. When nitrogen is substituted for carbon, the bond length between nitrogen and carbon different from the bond length between carbons results in distortion. A certain increase in the amount of boron relaxes the distortion, reduces crystal defects and distortion, and stabilizes and increases the life of nuclear magnetism serving as memory.

(10) Preferably, the boron content based on the number of atoms ranges from 1% to 10% of the nitrogen content based on the number of atoms. As described above, the presence of at least a certain amount of boron can reduce crystal defects and distortion, reduce electron trapping sites derived from boron, and secure a NV center necessary for sensing a certain amount or more.

(11) Preferably, a main surface of the single-crystal diamond has an inscribed circle diameter of 3 mm or more. This makes it easy to process the single-crystal diamond into a memory member. This also allows a large number of small memory members of 0.5 mm or less to be manufactured and reduces manufacturing costs.

(12) Preferably, the diameter is 5 mm or more. This makes it easier to process the single-crystal diamond into a memory member. This also allows a larger number of small memory members with a diameter of 0.5 mm or less to be manufactured and further reduces manufacturing costs.

(13) Preferably, the single-crystal diamond has a single sector content of 70% by volume or more. This can greatly reduce the influence of a sector boundary that causes distortion on the entire single crystal and further reduces the distortion of the single-crystal diamond.

(14) Preferably, the single sector content is 90% by volume or more. This almost eliminates the influence of a sector boundary that causes distortion on the entire single crystal and further reduces the distortion of the single-crystal diamond.

(15) The present disclosure provides a method of manufacturing the single-crystal diamond, the method including:

preparing a seed substrate; and growing a single-crystal diamond on the seed substrate by a high-temperature high-pressure synthesis method, wherein a main surface of the seed substrate has an inscribed circle diameter of more than 1.0 mm, the main surface has an etch-pit density of $1\times10^5/cm^2$ or less, and the main surface of the seed substrate has two or less growth sectors.

The present disclosure can provide a single-crystal diamond with fewer crystal defects and less distortion even to which nitrogen is added in a controlled manner. The present disclosure can provide a high-quality single-crystal diamond that can improve the memory function and memory stability when used as a material for a memory member.

Details of Embodiments of Present Disclosure

Specific examples of a single-crystal diamond according to the present disclosure are described below with reference to the accompanying drawings. In the present disclosure, like reference numerals denote like parts or equivalents thereof throughout the figures. For the sake of clarity and simplification of the drawings, the dimensions, such as length, width, thickness, and depth, are appropriately modified and do not necessarily represent actual dimensions.

The notation "A to B", as used herein, refers to the upper and lower limits of the range (that is, A or more and B or less). When the unit is not described in A but is described in B, the unit of A and the unit of B are the same.

The term "half-width", as used herein, refers to the "full width at half maximum (FWHM)".

In the crystallographic description herein, ( ) indicates an individual plane, and { } indicates a group plane.

First Embodiment: Single-Crystal Diamond

A single-crystal diamond according to an embodiment of the present disclosure (hereinafter also referred to as "the present embodiment")

has an X-ray diffraction rocking curve with a half-width of 20 seconds or less, wherein the X-ray diffraction rocking curve is measured with CuKα radiation in a (004) plane parallel arrangement using a diamond crystal as a first crystal in X-ray diffraction by a double-crystal method, a peak at a Raman shift in the range of 1332 $cm^{-1}$ to 1333 $cm^{-1}$ in a Raman spectrum has a half-width of 2.0 $cm^{-1}$ or less, the single-crystal diamond has an etch-pit density of 10,000/$cm^2$ or less, the etch-pit density is measured in an etching test, the single-crystal diamond has a nitrogen content in the range of 0.0001 ppm to 0.1 ppm based on the number of atoms, and the single-crystal diamond has a $^{13}C$ content in the range of 0.01% to 1.0% based on the number of atoms.

(X-Ray Diffraction Rocking Curve)

A single-crystal diamond having an X-ray diffraction rocking curve with a smaller half-width has higher crystallinity and fewer crystal defects and less distortion. The single-crystal diamond according to the present embodiment has an X-ray diffraction rocking curve with a half-width of 20 seconds or less, high crystallinity, and fewer crystal defects and less distortion.

The upper limit of the half-width of the X-ray diffraction rocking curve of the single-crystal diamond is 20 seconds or less, preferably 10 seconds or less, more preferably 8 seconds or less, still more preferably 6 seconds or less, from the perspective of improving crystallinity. The lower limit of the half-width of the X-ray diffraction rocking curve of the single-crystal diamond can be 4.2 seconds or more from the perspective of manufacture. The half-width of the X-ray diffraction rocking curve of the single-crystal diamond is preferably 4.2 seconds to 20 seconds, more preferably 4.2 seconds to 10 seconds, still more preferably 4.2 seconds to 8 seconds, still more preferably 4.2 seconds to 6 seconds.

The half-width of the X-ray diffraction rocking curve of the single-crystal diamond is measured with CuKα radiation in a (004) plane parallel arrangement using a diamond crystal as a first crystal in X-ray diffraction by a double-crystal method. In the double-crystal method, a diamond crystal cut out from the single-crystal diamond to be measured is used as the first crystal and a second crystal. The half-width of the rocking curve reflects the crystallinity of both the first crystal and the second crystal. Thus, when both the first crystal and the second crystal are diamond crystals cut out from the single-crystal diamond to be measured, the half-width of the rocking curve is a value that sensitively reflects the quality of the crystallinity of the sample.

It has been confirmed that the results do not vary even if the measurement is performed in different regions in a single-crystal diamond.

(Half-Width of Peak in Raman Spectrum)

A single-crystal diamond has higher crystallinity when a diamond phonon peak appearing at a Raman shift in the range of 1332 $cm^{-1}$ to 1333 $cm^{-1}$ in Raman spectroscopy of the single-crystal diamond is sharp and has a smaller half-width. The single-crystal diamond according to the present embodiment has a half-width of 2.0 $cm^{-1}$ or less in a peak at a Raman shift in the range of 1332 $cm^{-1}$ to 1333 $cm^{-1}$ in a Raman spectrum (hereinafter also referred to as a "half-width of a peak in a Raman spectrum") and has high crystallinity.

The upper limit of the half-width of a peak in a Raman spectrum of a single-crystal diamond is 2.0 $cm^{-1}$ or less, preferably 1.9 $cm^{-1}$ or less, more preferably 1.8 $cm^{-1}$ or less, still more preferably 1.7 $cm^{-1}$ or less. The lower limit of the half-width of a peak in a Raman spectrum of a single-crystal diamond can be 1.5 $cm^{-1}$ or more from the perspective of manufacture. The half-width of a peak in a Raman spectrum of a single-crystal diamond preferably ranges from 1.5 $cm^{-1}$ to 2.0 $cm^{-1}$, more preferably 1.5 $cm^{-1}$ to 1.9 $cm^{-1}$, still more preferably 1.5 $cm^{-1}$ to 1.8 $cm^{-1}$, still more preferably 1.5 $cm^{-1}$ to 1.7 $cm^{-1}$.

The half-width of a peak in a Raman spectrum is measured by the following procedure. First, a surface of a measurement sample, that is, a single-crystal diamond is polished with a metal bonded grinding wheel to a surface roughness Ra of 20 nm or less. The measurement sample is typically and preferably close to square or octagonal. The polished surface is irradiated with a laser under the following conditions, and scattered Raman lines are detected.

(Measurement Conditions)

Measuring apparatus: LabRAM HR-800 (manufactured by HORIBA Jobin Yvon)

Laser wavelength: 532 nm

Measurement temperature: room temperature (20° C. to 25° C.)

Wave number resolution: A value measured under the condition of 0.5 $cm^{-1}$ or less is defined as the half-width of a peak in a Raman spectrum of the single-crystal diamond according to the present embodiment. When the half-width derived from a light source and the apparatus is 0.5 $cm^{-1}$ or less, the measured value can be regarded as a half-width specific to the diamond regardless of the resolution of the apparatus. The half-width derived from the light source and the apparatus can be determined by measuring the half-width of a laser beam used as excitation light. When the half-width derived from the light source and the apparatus is more than 0.5 $cm^{-1}$ and less than 2.0 $cm^{-1}$, a half-width specific to the diamond can be determined by using the square root of a value obtained by subtracting the square of the half-width derived from the light source and the apparatus from the square of the measured half-width. A half-width derived from the light source and the apparatus above 2.0 $cm^{-1}$ is undesirable due to low accuracy.

Laser irradiation position (measurement region): A Raman line is detected at the following five positions (i) to (v):

(i) A Raman line is detected at the central portion of the polished surface of the measurement sample (at the position of the center of gravity in a two-dimensional plane).

(ii) A straight line is drawn from the central portion to an end portion of the polished surface, and a position P at which the straight line has the maximum length is specified. When the distance from the central portion to P is D1, a Raman line is detected at a position where the distance from the central portion is (3/4)D1 on the line segment from the central portion to P.

(iii) A straight line is drawn from the central portion in the direction opposite to P, and an intersection point Q between the straight line and the end portion of the polished surface is specified. Thus, P, the central portion, and Q are on a straight line L1. When the distance from the central portion to Q is D2, a Raman line is detected at a position where the distance from the central portion is (3/4)D2 on the line segment from the central portion to Q.

(iv) A straight line L2 passing through the central portion and perpendicular to the straight line L1 passing through P, the central portion, and Q is drawn, and intersection points R and S between the straight line L2 and the end portion of the polished surface are specified. When the distance from the central portion to R is D3, a Raman line is detected at a position where the distance from the central portion is (3/4)D3 on the line segment from the central portion to R.

(v) When the distance from the central portion to S is D4, a Raman line is detected at a position where the distance from the central portion is (3/4)D4 on the line segment from the central portion to S.

A spectrum analysis is performed on the Raman lines detected at the five positions to identify a diamond phonon peak appearing at a Raman shift in the range of 1332 $cm^{-1}$ to 1333 $cm^{-1}$. The Lorentz function is fitted to the diamond phonon peak by the least squares method to determine the half-width of the peak at each of the five positions at the Raman shift in the range of 1332 $cm^{-1}$ to 1333 $cm^{-1}$. Among the half-widths of the peaks at the five positions, the half-width at the central portion and the half-widths at the other four positions are weighted-averaged at a ratio of 4:1.

In a single-crystal diamond, the crystallinity, such as distortion, of a sample can be uniquely evaluated and compared among samples by the setting of the measurement regions at the five positions and by the calculation method of the weighted average thereof.

(Etch-Pit Density)

The term "etch-pit density", as used herein, refers to a measure indicating the number of linear defects derived from a needle-like defect linearly extending in a single-crystal diamond, and is measured in an etching test described later. A single-crystal diamond with a smaller etch-pit density has fewer defects and higher crystallinity. The single-crystal diamond according to the present embodiment has an etch-pit density of 10,000/$cm^2$ or less and high crystallinity.

From the perspective of improving the crystallinity, the upper limit of the etch-pit density of a single-crystal diamond is 10,000/$cm^2$ or less, preferably 1000/$cm^2$ or less, more preferably 100/$cm^2$ or less, still more preferably 10/$cm^2$ or less. The lower limit of the etch-pit density of a single-crystal diamond can be 0/$cm^2$ or more. The etch-pit density of a single-crystal diamond preferably ranges from 0/$cm^2$ to 10,000/$cm^2$, more preferably 0/$cm^2$ to 1000/$cm^2$, still more preferably 0/$cm^2$ to 100/$cm^2$, still more preferably 0/$cm^2$ to 10/$cm^2$.

The etch-pit density of the single-crystal diamond is measured in an etching test. More specifically, it is measured by the following procedure.

A single-crystal diamond is immersed in a potassium nitrate ($KNO_3$) melt etchant and is heated in a platinum crucible at 600° C. to 700° C. for 0.5 to 2 hours. After slow cooling, the single-crystal diamond is taken out, and the main growth surface is observed with an optical microscope. An inverted pyramidal etch pit is observed, and the size of the etch pit is adjusted by the crucible temperature and the treatment time depending on the etch-pit density. For this adjustment, first, the etch-pit density is roughly determined by treatment under conditions where a small etch pit can be formed (the crucible temperature and the treatment time), and the measurement conditions (the crucible temperature and the treatment time) are then determined.

The dimensions (size) of an etch pit are determined for each etch-pit density such that etch pits do not overlap. The number of etch pits does not change while the etch pits are enlarged, and the size of etch pits is adjusted to the size of the field of view to be evaluated (the density of etch pits). As an example of the adjustment, at an etch-pit density as high as 5000/$cm^2$ or more, the size of etch pits ranges from approximately 5 to 20 μm square such that etch pits do not overlap. Three regions with a high etch-pit density are selected in a growth surface, and a rectangular measurement region of 1 mm or less is determined in each region. The area where 100 etch pits are present is measured in each measurement region, and the number of etch pits per $cm^2$ is calculated on the basis of the number of etch pits (100) and the area. The average of the etch-pit densities in the three measurement regions is referred to as "the etch-pit density of a single-crystal diamond" in the present description.

At an etch-pit density of less than 5000/$cm^2$, the conditions under which etch pits are formed (the crucible temperature and the treatment time) are changed to gradually increase the size of etch pits such that the etch pits can be observed with a microscope at a low magnification. In a sample in which a portion with a high density cannot be determined, etch pits are counted over the entire sample growth surface, and the number of etch pits per $cm^2$ (the etch-pit density) is calculated. This etch-pit density is referred to as "the etch-pit density of a single-crystal diamond" in the present description.

The term "etch pit", as used herein, refers to a clear inverted pyramidal pit. Etch pits of approximately the same size are distributed and can be identified as etch pits. In a sample of 5000/$cm^2$ or more, etch pits with a size in the range of ¼ of the size of the majority of etch pits (the size of d50 on an area basis) to the largest size are counted. In a sample of less than 5000/$cm^2$, etch pits with a size in the range of ⅛ of the size of the majority of etch pits (the size of d50 on an area basis) to the largest size are counted.

In the present description, the number of etch pits per $cm^2$ (the etch-pit density) corresponds to the density of the linear defects. In a single-crystal diamond, the average number of etch pits in the measurement method is referred to as "the density of dislocation defects passing through the main growth surface" in the present embodiment.

(Nitrogen Content)

Lone nitrogen in a single-crystal diamond causes a crystal defect and distortion, and the amount of nitrogen is therefore preferably reduced. However, nitrogen is an element of a luminescent center indispensable for an application using a nuclear spin for memory, must interact optimally with an atom having a nuclear spin, and is therefore preferably present as much as possible to increase interaction probability. There is therefore an optimal range. In the single-crystal diamond according to the present embodiment, the nitrogen content based on the number of atoms (hereinafter also referred to as "the nitrogen content") ranges from 0.0001 ppm to 0.1 ppm. In the single-crystal diamond, this reduces crystal defects and distortion, and nitrogen interacts optimally with an atom having a nuclear spin.

From the perspective of a single NV center, the lower limit of the nitrogen content of the single-crystal diamond is 0.0001 ppm or more, preferably 0.001 ppm or more, more preferably 0.005 ppm or more, still more preferably 0.01 ppm or more. The nitrogen content of the single-crystal diamond ranges from 0.0001 ppm to 0.1 ppm, preferably 0.001 ppm to 0.1 ppm, more preferably 0.005 ppm to 0.1 ppm, still more preferably 0.01 ppm to 0.1 ppm.

The nitrogen content of a single-crystal diamond is measured by secondary ion mass spectrometry (SIMS) or ESR.

(Boron Content)

Boron in a single-crystal diamond causes a crystal defect and distortion. In the single-crystal diamond according to the present embodiment, the boron content based on the number of atoms (hereinafter referred to as "the boron content") is preferably equal to or lower than the nitrogen content based on the number of atoms. This reduces crystal defects and distortion in the single-crystal diamond.

With respect to the upper limit of the boron content of the single-crystal diamond, from the perspective that a NV center is indispensable for taking a spin in and out in an application using a nuclear spin for memory, and from the perspective of existence and an increase in an effective NV center, boron, which eliminates a NV center, is preferably equal to or lower than the nitrogen content, more preferably 10% or less of the nitrogen content, still more preferably 1% or less of the nitrogen content, still more preferably 0.1% or less of the nitrogen content. The lower limit of the boron content of the single-crystal diamond is preferably as low as possible and is therefore preferably 0 ppm or more. The boron content of the single-crystal diamond is preferably 0 ppm or more and equal to or lower than the nitrogen content, more preferably 0 ppm or more and 10% or less of the nitrogen content, still more preferably 0 ppm or more and 1% or less of the nitrogen content, still more preferably 0 ppm or more and 0.1% or less of the nitrogen content. The lower limit of the boron content of the single-crystal diamond is preferably 1% or more of the nitrogen content from the perspective of manufacture. Thus, the boron content of the single-crystal diamond preferably ranges from 1% to 10% of the nitrogen content.

On the other hand, when a single-crystal diamond contains nitrogen and boron at a predetermined ratio, crystal defects and distortion derived from nitrogen and boron tend to be reduced. From this perspective, the boron content of the single-crystal diamond is preferably 0.5% or more of the nitrogen content and lower than the nitrogen content, more preferably 1% to 30% of the nitrogen content, still more preferably 3% to 10% of the nitrogen content. Boron has the effect of reducing a NV center available for a memory application of a nuclear spin, but is effective in reducing crystal defects and distortion, preventing crystal disturbance, and allowing a nuclear spin to have time to exchange information with an electron spin.

The boron content of a single-crystal diamond is measured by secondary ion mass spectrometry (SIMS).

($^{13}C$ Content)

In the single-crystal diamond according to the present embodiment, the $^{13}C$ content based on the number of atoms preferably ranges from 0.01% to 1.0%. $^{13}C$ is an atom that provides a nuclear spin for memory, is required in a certain amount range, and in this range increases the probability of interaction with a NV center. From the perspective that a plurality of $^{13}C$ atoms do not overlap, the upper limit of the $^{13}C$ content based on the number of atoms of the single-crystal diamond is 1.0% or less, preferably 0.5% or less, more preferably 0.3% or less, still more preferably 0.1% or less. From the perspective of the necessity of being adjacent to a NV center at a certain distance for memory, the lower limit of the $^{13}C$ content based on the number of atoms of the single-crystal diamond is preferably 0.01% or more. The $^{13}C$ content based on the number of atoms of the single-crystal diamond ranges from 0.01% to 1.0%, preferably 0.01% to 0.5%, more preferably 0.01% to 0.3%, still more preferably 0.01% to 0.1%. A natural diamond has a $^{13}C$ content of approximately 1.1%.

The $^{13}C$ content based on the number of atoms of a single-crystal diamond is measured by SIMS analysis.

It has been confirmed that the measurement results do not vary even if the setting position in the measurement region in a single-crystal diamond is randomly changed.

(Number of Defects)

A defect in a single-crystal diamond may be a point defect, such as a vacancy, a linearly extending needle-like defect, an impurity, a stacking fault, a distortion, or the like. Among these defects, a linear defect and a stacking fault can be identified in an X-ray topographic image. These defects have higher X-ray reflection intensity than the rest of the crystal (a portion with fewer defects, that is, a portion with high crystallinity) and, in an X-ray topographic image, are indicated as dark portions in a positive image and as bright portions in a negative image. The term "the number of defects", as used herein, refers to a measure indicating the number of defects derived from the number of linear defects in a single-crystal diamond.

The number of defects in the single-crystal diamond according to the present embodiment is preferably $1000/cm^2$ or less. This further reduces crystal defects and distortion in the single-crystal diamond. From the perspective of reducing crystal defects and distortion, the upper limit of the number of defects of the single-crystal diamond is preferably $1000/cm^2$ or less, more preferably $100/cm^2$ or less, still more preferably $10/cm^2$ or less, still more preferably $5/cm^2$ or less. The lower limit of the number of defects in the single-crystal diamond is preferably $0/cm^2$ or more. The number of defects in the single-crystal diamond preferably ranges from $0/cm^2$ to $1000/cm^2$, more preferably $0/cm^2$ to $100/cm^2$, still more preferably $0/cm^2$ to $10/cm^2$, still more preferably $0/cm^2$ to $5/cm^2$.

(Phase Difference)

A diamond is an isotropic crystal and typically has an isotropic refractive index (a dielectric constant). On the other hand, a diamond with a defect and distortion has a birefringence index. A defect in a diamond irradiated with circularly polarized light causes a phase difference between polarized light along the slow axis and polarized light along the fast axis and emits elliptically polarized light (including linearly polarized light). An anisotropic refractive index due to a defect or distortion in a diamond crystal results in a polarization direction in which light is slowest (the slow axis) and a polarization direction in which light is fastest (the fast axis). On the other hand, when irradiated with circularly polarized light, a portion with an isotropic refractive index other than the defects causes no phase difference and emits the circularly polarized light. The optical axis and the phase difference can be determined by determining the directions of the major axis and the minor axis of the ellipse in elliptically polarized light and the ratio of the length of the major axis to the length of the minor axis. Furthermore, a lens and a microscope can be combined to acquire information on a local phase difference in a fine portion. Furthermore, polarizers integrated in front of pixels of a digital detector can be arranged to two-dimensionally acquire information in each pixel (that is, information at a local position of the sample).

The phase difference measured at each local position is a value integrated in the thickness direction of the substrate. Thus, samples with the same thickness are compared, or samples with the normalized thickness are compared. For normalization with respect to thickness, the phase difference is described on the basis of a thickness of 1 mm (unit: nm/mm). For example, for conversion based on a thickness of 1 mm, a value measured at a thickness of 0.1 mm is multiplied by 10, a value measured at a thickness of 0.2 mm is multiplied by 5, and a value measured at a thickness of 0.5 mm is multiplied by 2.

The value of a two-dimensional phase difference indicates the distribution on a substrate surface. The characteristics of a substrate are appropriately represented by an in-plane average value. The term "an average of a phase difference of a substrate" means an average value in an effective area within the size of the substrate. The term "effective area", as used herein, refers to an area portion excluding an end portion of a substrate because the value of the phase difference cannot be accurately measured at the end portion of the substrate. More precisely, when the distance from the center of gravity to an end of the main surface of a substrate is 100%, the effective area is defined as the area within the distance range from the center of gravity to 90%. The term "an average value in an effective area", as used herein, does not mean the phase difference per area, but refers to a value obtained by averaging the phase difference of each local portion over the plane, and refers to the average of the frequency distribution of the phase difference in the plane. Thus, the average value is also expressed in nm/mm.

Even if the number of defects in a single crystal is constant, the phase difference is accumulated and increased in a substrate with a larger thickness. Furthermore, in a substrate with a larger area, defects have a greater influence on the entire surface, and the phase difference is increased. For such reasons, a smaller phase difference per unit thickness and/or a smaller average of a phase difference of the in-plane frequency distribution results in a diamond with higher quality. Even if the phase difference is the same, a larger substrate results in a diamond with higher quality. This is because cutting into small pieces relaxes the stress and reduces the phase difference. As a parameter of the distortion quality, the magnitude of the phase difference and the size of the substrate have an influence.

The phase difference has a positive correlation with the number of defects and the magnitude of distortion in a single-crystal diamond. The single-crystal diamond according to the present embodiment preferably has an average of a phase difference per unit thickness of 30 nm/mm or less. This further reduces crystal defects and distortion in the single-crystal diamond. From the perspective of reducing defects and distortion, the upper limit of the average of the phase difference per unit thickness of the single-crystal diamond is preferably 30 nm/mm or less, more preferably 10 nm/mm or less, still more preferably 5 nm/mm or less, still more preferably 2 nm/mm or less. The lower limit of the average of the phase difference per unit thickness of the single-crystal diamond is preferably 0 nm/mm. From the perspective of manufacture, the lower limit of the standard deviation of the phase difference can be, for example, 0.01 nm/mm or more. The average of the phase difference per unit thickness of the single-crystal diamond preferably ranges from 0 nm/mm to 30 nm/mm, more preferably 0 nm/mm to 10 nm/mm, still more preferably 0 nm/mm to 5 nm/mm, still more preferably 0 nm/mm to 2 nm/mm. From the perspective of manufacture, the average of the phase difference per unit thickness of the single-crystal diamond preferably ranges from 0.01 nm/mm to 30 nm/mm, more preferably 0.01 nm/mm to 10 nm/mm, still more preferably 0.01 nm/mm to 5 nm/mm, still more preferably 0.01 nm/mm to 2 nm/mm.

The phase difference per unit thickness of a single-crystal diamond is measured by the following procedure. First, a single-crystal diamond is processed into a sheet with a thickness in the range of 0.1 to 5 mm. The processing method may be polishing or etching. The phase difference per unit thickness is a value based on a single-crystal diamond with a thickness of 1 mm.

Next, the phase difference of a single-crystal diamond is measured with a birefringence distribution measuring apparatus ("WPA-micro" (trademark) or "WPA-100" (trademark) manufactured by Photonic Lattice, Inc.). Although a phase difference of more than 90 degrees (¼ of the wavelength) is usually difficult to discriminate, this birefringence distribution measuring apparatus uses an integrated wave plate system instead of an integrated polarizer system, and the measurement range is extended to a phase difference of 180 degrees (½ of the wavelength). It has been experimentally verified that the use of three wavelengths (one center wavelength and two wavelengths close to the center wavelength) extends the measurement range to five to six times the wavelength. The average of the phase difference per unit thickness is determined by processing a value measured with the birefringence distribution measuring apparatus using software ("PA-View" (trademark) manufactured by Photonic Lattice, Inc.).

In a single-crystal diamond, the measuring apparatus measures the surface distribution to calculate an in-plane average, which is not affected by the measurement arrangement. It has been confirmed that the measurement results do not vary even if the setting position in the measurement region is randomly changed.

(NV Center)

As illustrated in FIG. 1, a NV center 100 is a complex defect composed of a substitutional nitrogen atom (N) and a vacancy (V) formed by eliminating carbon adjacent to the substitutional nitrogen atom in a diamond crystal. The NV center captures one electron and is negatively (−) charged, forming a state called a spin triplet in which a spin is manipulated by light. The NV center can detect single light and is stable, can be used very conveniently, and is suitable for an application using a nuclear spin for memory.

The single-crystal diamond according to the present embodiment preferably has a NV center and has a NV center content of 0.1 ppm or less. The NV center can be formed, for example, by irradiating a single-crystal diamond with an electron beam having an energy of 3 MeV and then performing vacuum annealing treatment at 900° C. The electron-beam irradiation amount is preferably in the proper range by changing the dose according to the nitrogen content of a single-crystal diamond. Thus, the single-crystal diamond can form a single NV center without noise and is suitable for an application using a nuclear spin for memory. The phrase "a single-crystal diamond has a NV center", as used herein, means that the single-crystal diamond has a NV center content of not less than the concentration at which fluorescence can be detected by a NV center measurement method described later. From the perspective of the detectivity of fluorescence, the lower limit of the NV center content of the single-crystal diamond is preferably 0.00001 ppm or more, more preferably 0.001 ppm or more, still more preferably 0.005 ppm or more. The single-crystal diamond preferably has a NV center and has a NV center content of 0.1 ppm or less, and the NV center content preferably ranges from 0.00001 ppm to 0.1 ppm, more preferably 0.001 ppm to 0.1 ppm, still more preferably 0.005 ppm to 0.1 ppm.

The NV center content of the single-crystal diamond is observed and calculated by an electron spin resonance method (ESR). At a low concentration, measurement can be performed by observation with a fluorescence microscope and by counting single NV centers. At a high concentration, a value at a low concentration can be converted into fluorescence intensity, and the fluorescence intensity ratio can be converted.

(Size)

A main surface of a single-crystal diamond preferably has an inscribed circle diameter of 3 mm or more. This makes it easy to process the single-crystal diamond into a memory member. This also reduces the manufacturing costs of a large number of small memory members with a diameter of 0.5 mm or less. From the perspective of processability and reduction in manufacturing costs, the lower limit of the inscribed circle diameter of the main surface of the single-crystal diamond is preferably 3 mm or more, more preferably 4 mm or more, still more preferably 5 mm or more, still more preferably 7 mm or more. From the perspective of manufacture, the upper limit of the inscribed circle diameter of the main surface of the single-crystal diamond may be 50 mm or less. The inscribed circle diameter of the main surface of the single-crystal diamond preferably ranges from 3 mm to 50 mm, more preferably 4 mm to 50 mm, still more preferably 5 mm to 50 mm, still more preferably 7 mm to 50 mm.

The inscribed circle diameter of the main surface of the single-crystal diamond is measured with an optical microscope with a length measurement function.

(Single Sector Content)

The single-crystal diamond according to the present embodiment preferably has a single sector content of 70% by volume or more. This can greatly reduce the influence of a sector boundary that causes distortion on the entire single crystal. This also reduces the manufacturing costs of a large number of small homogeneous memory members with a diameter of 0.5 mm or less. The term "sector", as used herein, refers to a region grown from a specific different crystal plane (base substrate). The sectors in the single-crystal diamond include a {001} sector, a {113} sector, a {115} sector, and a {111} sector. One single crystal is grown from a crystal plane of each plane orientation as a base substrate. The term "{abc} sector", as used herein, refers to a region grown from an {abc} plane (base substrate). Among these, the single sector is preferably a {100}, {111}, or {113} sector from the perspective of easily forming a stable plane and forming a flat plane.

The lower limit of the single sector content of the single-crystal diamond is preferably 70% by volume or more, more preferably 80% by volume or more, still more preferably 90% by volume or more, still more preferably 95% by volume or more. The upper limit of the single sector content of the single-crystal diamond may be 100% by volume or less. The single-crystal diamond preferably has a single sector content in the range of 70% by volume to 100% by volume, more preferably 80% by volume to 100% by volume, still more preferably 90% by volume to 100% by volume, still more preferably 95% by volume to 100% by volume.

The single sector content of a single-crystal diamond is measured by the following procedure. Growth sectors have different impurity concentrations and therefore have different fluorescence intensities. Thus, the fluorescence distribution on a substrate surface is determined by a photoluminescence method (PL) or a cathodoluminescence method (CL), and a boundary thereof is identified as a clear line. Across section thereof is formed in the growth direction, and a boundary in the depth direction can also be identified. A sector boundary is a two-dimensionally approximately straight line or a three-dimensionally approximately flat plane, and the area ratio, the volume ratio, and the largest-sector content can therefore be determined using the boundary of the straight line or the flat plane. Furthermore, a confocal microscope can also be used to determine a three-dimensional sector region distribution. It is also possible to calculate the ratio of a single sector based on the ratio of the area exposed on the surface.

Second Embodiment: Method of Manufacturing Single-Crystal Diamond

The single-crystal diamond according to the first embodiment can be synthesized by a temperature difference method of a high-temperature high-pressure synthesis method.

When a single-crystal diamond is synthesized by the temperature difference method of the high-temperature high-pressure synthesis method, a seed substrate has a great influence on the crystallinity of a single-crystal diamond grown thereon.

A known seed crystal (seed substrate) has a size of less than 0.5 mm and has the same thickness as the size. The seed crystal is utilized as a whole. More specifically, the crystal is grown not only from the upper surface of the seed crystal but also from the side surface thereof to enlarge the entire crystal. A small seed crystal has a small absolute number of defects. Thus, a single-crystal diamond thus grown has a low defect density. Thus, a seed crystal with a smaller size is preferred to grow a single-crystal diamond with a lower defect density.

On the other hand, it is known that a larger seed crystal is more advantageous to grow a larger single-crystal diamond. However, there are disadvantages that a large seed crystal has an increased absolute number of defects, and a portion with a high defect density in a single crystal must be used. Furthermore, five or more growth sectors may be mixed in a large seed crystal. Different growth sectors have different impurity concentrations, which adversely affect crystal distortion.

To manufacture a high-quality large single-crystal diamond, it is important to increase the size of a seed substrate. A main surface of a seed substrate preferably has an inscribed circle diameter of 1.0 mm or more, more preferably more than 1.0 mm, still more preferably 2.0 mm or more, still more preferably 3.0 mm or more. From the perspective of manufacture, the upper limit of the size of a seed substrate may be, but is not limited to, for example, 50 mm or less.

In a manufacturing method according to the present embodiment, a crystal grown from a side surface of a seed substrate is not regarded as important, and the substrate therefore preferably has a small thickness. From the perspective of reducing the occurrence of cracking at high temperature and pressure, the ratio of the thickness to the main surface size (the inscribed circle diameter) (=thickness/size) preferably ranges from 0.1 to 0.5.

On a large seed substrate, a growth sector that is the same as the main surface is grown in a grown single-crystal diamond. Depending on how the substrate is cut out, a large substrate with a single growth sector can be manufactured. It is also possible to manufacture a substrate on which the ratio of a single growth sector is increased.

Next to the size of the seed substrate are the number of defects in the seed substrate and the number of growth sectors. The etch-pit density of the main surface of the seed substrate is preferably $1\times10^5/cm^2$ or less, more preferably $5\times10^3/cm^2$ or less, still more preferably $1000/cm^2$ or less, still more preferably $100/cm^2$ or less. The lower limit of the etch-pit density may be, but is not limited to, $0/cm^2$ or more.

Growth sectors are two regions grown on different plane orientations. Different growth sectors have different impurity concentrations, and distortion is accumulated near the boundary between the growth sectors. Thus, the number of growth sectors in the main surface of the seed substrate is two or less, preferably one. The number of growth sectors preferably ranges from one to two.

In the manufacturing method according to the present embodiment, as described above, a single-crystal diamond with a controlled etch-pit density or a controlled number of growth sectors can be used as a seed substrate to manufacture a high-quality single-crystal diamond with fewer defects and less distortion that can improve the memory function and memory stability when used as a material for a memory member.

The ratio N2/N1 of the nitrogen content N2 based on the number of atoms of the single-crystal diamond grown on a seed substrate to the nitrogen content N1 based on the number of atoms of the seed substrate preferably ranges from 0.2 to 5. This eliminates the lattice mismatch between the seed substrate and the single-crystal diamond. Thus, a high-quality single-crystal diamond with fewer defects and less distortion that can improve the memory function and memory stability when used as a material for a memory member can be provided.

The specific manufacturing method is described below.

(Preparing Seed Substrate)

A diamond seed substrate to be used in a temperature difference method described later is prepared. The following diamond seed substrate A or B is prepared as the diamond seed substrate.

Figure 2:
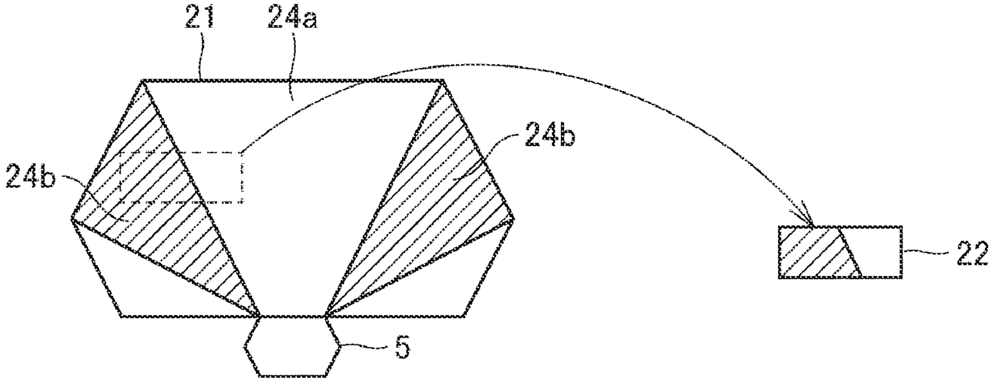
FIG. 2 is a view of another example of a diamond seed substrate used in a method of manufacturing a single-crystal diamond according to a second embodiment.
Figure 3:
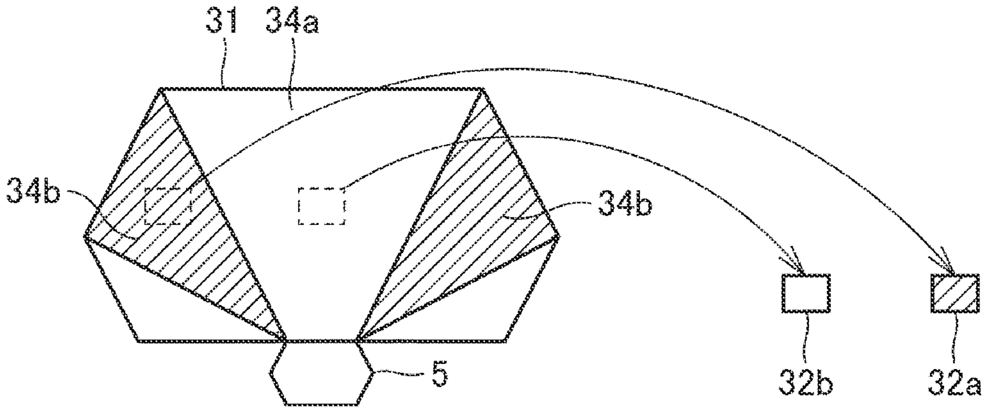
FIG. 3 is a view of another example of a diamond seed substrate used in the method of manufacturing a single-crystal diamond according to the second embodiment.

As illustrated in FIGS. 2 and 3, each single-crystal diamond material synthesized by the temperature difference method has a plurality of growth sectors. In FIGS. 2 and 3, each of reference numerals 24*a* and 34*a* denotes a first sector, and each of reference numerals 24*b* and 34*b* denotes a second sector. The first sector is different from the second sector. The first sector and the second sector are, for example, a {001} sector, a {113} sector, a {115} sector, a {111} sector, or the like.

The diamond seed substrate A has a size (inscribed circle diameter) of 1 mm or more, preferably 5 mm or more, and has a nitrogen content of 0.01 ppm or less based on the number of atoms. The etch-pit density is $5\times10^3/cm^2$ or less. Due to a low nitrogen content, the seed substrate A, even if containing a plurality of sectors, can have fewer minute lattice mismatches due to a difference in nitrogen content between sectors and have less distortion caused by the mismatches.

The diamond seed substrate B has a size of 1 mm or more, preferably 5 mm or more, and has a nitrogen content in the range of 100 ppm to 150 ppm based on the number of atoms. The etch-pit density is $1\times10^5/cm^2$ or less. The seed substrate B has a large size at the expense of defects. A large seed substrate can be utilized to increase the single growth sector ratio of a single-crystal diamond grown thereon and reduce the distortion of the grown single-crystal diamond.

In the diamond seed substrate A and the diamond seed substrate B, as illustrated in FIGS. 2 and 3, diamond seed substrates 22, 32*a*, and 32*b* with a single or a plurality of growth sectors can be cut out. The cutting is preferably performed with a water guard laser beam machine. This can improve processing accuracy and can provide a diamond seed substrate of 1 mm or more with a single growth sector (the number of sectors is one). The diamond seed substrates preferably have a size of 1.5 mm or more.

(Growing Single-Crystal Diamond)

Next, a single-crystal diamond is grown on the seed substrate by a high-temperature high-pressure synthesis method. Thus, the single-crystal diamond according to the first embodiment can be manufactured. The single-crystal diamond has fewer crystal defects and less distortion.

Figure 4:
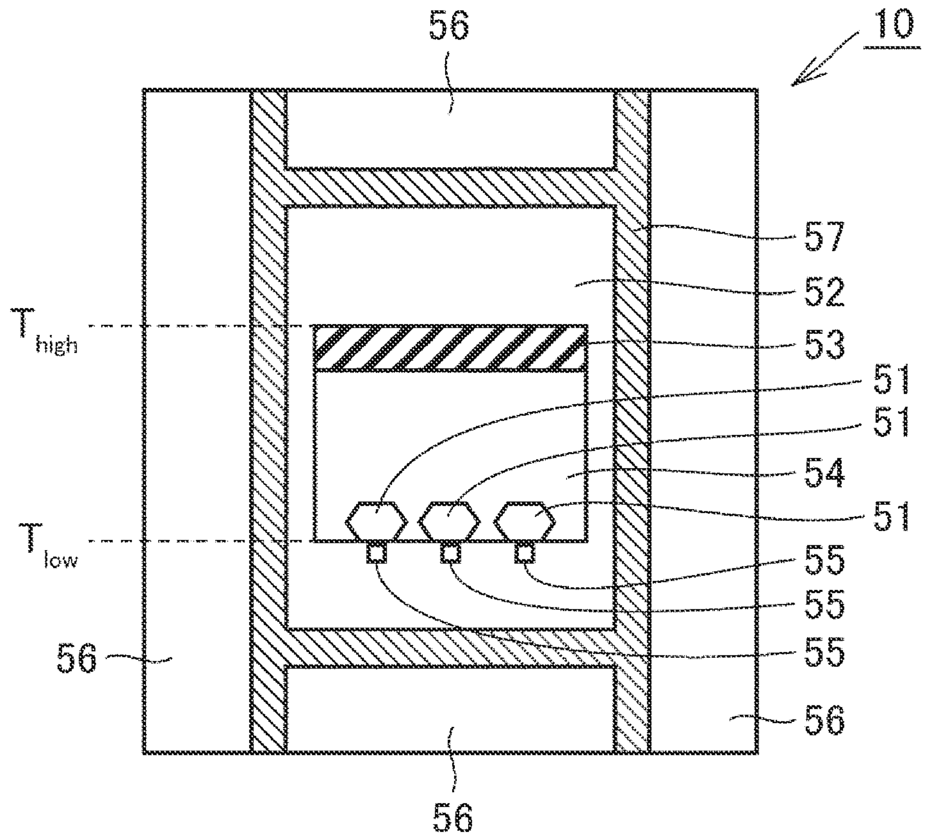
FIG. 4 is a schematic view of a sample chamber used in the method of manufacturing a single-crystal diamond according to the second embodiment.

The temperature difference method of the high-temperature high-pressure method is performed, for example, in a sample chamber with a structure illustrated in FIG. 4.

As illustrated in FIG. 4, a sample chamber 10 used to manufacture a single-crystal diamond 51 includes an insulator 52, a carbon source 53, a solvent metal 54, and a diamond seed substrate 55 in a space surrounded by a graphite heater 57, and includes a pressure medium 56 outside the graphite heater 57. The temperature difference method is a synthesis method of providing a vertical temperature gradient in the sample chamber 10, placing the carbon source 53 in a high-temperature portion ($T_{high}$), placing the diamond seed substrate 55 in a low-temperature portion ($T_{low}$), placing the solvent metal 54 between the carbon source 53 and the diamond seed substrate 55, and growing the single-crystal diamond 51 on the diamond seed substrate 55 at a temperature not lower than the temperature at which the solvent metal 54 melts and at a pressure not lower than the pressure at which the diamond is thermally stable.

The carbon source 53 is preferably a diamond powder. Graphite or pyrolytic carbon may also be used. The solvent metal 54 may be one or more metals selected from iron (Fe), cobalt (Co), nickel (Ni), manganese (Mn), and the like, or an alloy containing these metals.

Titanium (Ti) is preferably added as a nitrogen getter to the solvent metal 54 at a concentration of 3.0% by mass or more. This can control the nitrogen content based on the number of atoms of the single-crystal diamond to be 0.1 ppm or less.

Boron (B) is preferably added to the solvent metal 54 at a concentration in the range of 0.002 to 0.2 ppm. This can control the boron content in the range of 0.00001 to 0.001 ppm based on the number of atoms of the single-crystal diamond.

In the temperature difference method, the purity of a carbon source, graphite, is controlled to intentionally leave $^{13}C$ in the crystal. This can control the $^{13}C$ content in the crystal. This method is not employed in known temperature difference methods.

The nitrogen content based on the number of atoms of a single-crystal diamond grown on the diamond seed substrate preferably ranges from 0.1 to 10 times the nitrogen content based on the number of atoms of the diamond seed substrate. This can reduce defects and distortion in the crystal due to the addition of nitrogen.

A NV center in a single-crystal diamond can be formed, for example, by electron-beam irradiation with an energy of 3 MeV at a dose (electron-beam irradiation amount) of $3\times10^{17}$ $cm^2$ per ppm of nitrogen content based on the number of atoms of the single-crystal diamond and then by annealing the single-crystal diamond in a vacuum at 900° C. This can form a NV center in an amount smaller than the nitrogen content. The electron-beam irradiation dose is preferably increased for a sample with a high nitrogen content and is preferably decreased for a sample with a low nitrogen content.

Examples

The present embodiment is more specifically described with reference to examples. However, the present embodiment is not limited by these examples.

In the following examples, the half-width of a peak at a Raman shift in the range of 1332 $cm^{-1}$ to 1333 $cm^{-1}$ in a Raman spectrum of a single-crystal diamond was determined by measurement with a double monochromator Raman spectrometer at a wave number resolution of 0.5 $cm^{-1}$ or less or with a LabRAM HR-800 (manufactured by HORIBA Jobin Yvon), and by conversion to the half-width of the diamond itself in consideration of the resolution of a light source and the apparatus.

<Manufacture of Single-Crystal Diamond>

A diamond seed substrate is cut out from a single-crystal diamond material manufactured by the temperature difference method so as to include a single growth sector or a plurality of sectors, thereby preparing the diamond seed substrate A and the diamond seed substrate B described in the second embodiment. In each sample, the type and the size of the diamond seed substrate, the number of growth sectors in the diamond seed substrate, and the etch-pit density are shown in the columns of "Type", "Size", "Number of growth sectors", and "Etch-pit density" of "Diamond seed substrate" in Table 1.

TABLE 1

| | Diamond seed substrate | | | | Synthesis conditions | |
|---|---|---|---|---|---|---|
| Sample No. | Type | Size (mm) | Number of growth sectors (—) | Etch-pit density ($/cm^2$) | Ti addition amount (mass %) | Synthesis time (h) |
| Sample 1 | A | 2.0 | 1 | 5 | 3.0 | 120 |
| Sample 2 | A | 1.5 | 1 | 15 | 3.0 | 140 |
| Sample 3 | A | 1.5 | 1 | 50 | 3.0 | 155 |
| Sample 4 | A | 2.0 | 1 | 80 | 3.0 | 120 |
| Sample 5 | A | 3.0 | 1 | 5 | 3.5 | 135 |
| Sample 6 | B | 1.5 | 2 | 800 | 3.5 | 110 |
| Sample 7 | B | 2.0 | 2 | 4000 | 4.0 | 120 |
| Sample 8 | B | 2.0 | 2 | 7000 | 4.5 | 120 |
| Sample 9 | A | 1.0 | 3 | 2000 | 3.5 | 110 |
| Sample 10 | B | 2.0 | 5 | 25000 | 3.0 | 90 |

For example, the diamond seed substrate used in Sample 1 has a size of 2.0 mm and an etch-pit density of $5/cm^2$.

Next, a single-crystal diamond is grown on the diamond seed substrate by the temperature difference method of the high-temperature high-pressure method to manufacture a single-crystal diamond of each sample. The temperature difference method is performed in a sample chamber with the structure illustrated in FIG. 4.

Methane gas with a carbon isotope $^{12}C$ concentration of 99.95% or more is passed through titanium sponge heated to 600° C. or more to remove nitrogen from the methane gas. The methane gas from which nitrogen has been removed is blown onto a Ta substrate without Ni heated to a high temperature of 1900° C. in a vacuum chamber. The methane gas is decomposed on the Ta substrate, forming graphite with a size of 10 mm×10 mm and with a carbon isotope $^{12}C$ concentration in the range of 99.95% to 99.99% on the Ta substrate. The graphite is used as a carbon source.

Fe and Co to which a trace amount of boron is added are used in a metal solvent, and the solvent composition is Fe/Co=60/40 (weight ratio). Boron in the solvent was 0.2 ppm as analyzed by SIMS. A high-purity Fe—Co—Ti alloy to which Ti is added as a nitrogen getter in an amount described in "Ti addition amount" of "Synthesis conditions" in Table 1 (3% by mass in Sample 1) is prepared as a metal solvent. To prevent the contamination of carbon isotope $^{12}C$ from the surroundings, the heater surface is coated with graphite having a carbon isotope $^{12}C$ concentration of 99.999% or more.

Next, a diamond synthesis system in which a seed crystal, a solvent, and high-purity graphite with concentrated isotope as a carbon source are arranged in this order from the bottom is enclosed in a cup-shaped Fe cell without carbon or N1, and the upper surface thereof is sealed in a vacuum of $10^{-3}$ Pa or less.

This is held at a pressure of 5.5 Pa and a temperature of 1300° C. for the time described in "Synthesis time" of "Synthesis conditions" in Table 1 (for example, 120 hours for Sample 1) using an ultra-high pressure generator to grow a diamond on the seed crystal. The temperature is then lowered to room temperature, and the pressure is then reduced to take out the synthesized single-crystal diamond.

The single-crystal diamond was irradiated with an electron beam having an energy of 3 MeV at a dose of $3\times10^{17}$ $cm^{-2}$ per ppm of nitrogen content based on the number of atoms in the single-crystal diamond, and was then annealed in a vacuum at 900° C. to manufacture a single-crystal diamond of each sample.

<Evaluation>

The following were measured in the single-crystal diamond of each sample before the electron-beam irradiation: the size, the half-width of an X-ray diffraction rocking curve, the half-width of a peak in a Raman spectrum, the etch-pit density, the number of defects identified in an X-ray topographic image, the average of the phase difference, the nitrogen content, the $^{13}C$ content, the boron content, the cutout size, and the single sector content. The NV center content was measured in the single-crystal diamond of each sample after the electron-beam irradiation. A specific measurement method of each item is described in the first embodiment. The results are shown in Table 2 in the columns of "Size", "FWHM of Xrc", "Raman half-width", "Etch-pit density", "Number of defects", "Average phase difference", "N", "13C", "B", "Cutout size", "Single sector", and "NV" of the single-crystal diamond. All the samples evaluated in the present example had a thickness of 0.4 mm. It has been confirmed that the electron-beam irradiation negligibly changes the measurement results of the size, the half-width of an X-ray diffraction rocking curve, the half-width of a peak in a Raman spectrum, the etch-pit density, the number of defects identified in an X-ray topographic image, the average of the phase difference, the nitrogen content, the $^{13}C$ content, the boron content, the cutout size, and the single sector content of the single-crystal diamond.

TABLE 2

| | Single-crystal diamond | | | | | | | | | | | | |
|---|---|---|---|---|---|---|---|---|---|---|---|---|---|
| Sample No. | Size (mm) | FWHM of Xrc (s) | Raman half-width ($cm^{-1}$) | Etch-pit density ($/cm^2$) | Number of defects ($/cm^2$) | Average phase difference (nm/mm) | N (ppm) | 13C (%) | B (ppm) | B/N (%) | Cutout size (mm) | Single sector (%) | NV (ppm) |
| Sample 1 | 6 | 5 | 1.55 | 7 | 7 | 1 | 0.098 | 0.03 | 0.0008 | 0.8163 | 4 | 89 | 0.05 |
| Sample 2 | 6 | 8 | 1.55 | 20 | 20 | 8 | 0.069 | 0.09 | 0.00005 | 0.0725 | 3 | 96 | 0.03 |
| Sample 3 | 7 | 7 | 1.50 | 65 | 65 | 4 | 0.016 | 0.06 | 0.0001 | 0.625 | 5 | 92 | 0.01 |

TABLE 2-continued

| | Single-crystal diamond | | | | | | | | | | | | |
|---|---|---|---|---|---|---|---|---|---|---|---|---|---|
| Sample No. | Size (mm) | FWHM of Xrc (s) | Raman half-width ($cm^{-1}$) | Etch-pit density ($/cm^2$) | Number of defects ($/cm^2$) | Average phase difference (nm/mm) | N (ppm) | 13C (%) | B (ppm) | B/N (%) | Cutout size (mm) | Single sector (%) | NV (ppm) |
| Sample 4 | 6 | 12 | 1.60 | 92 | 92 | 16 | 0.037 | 0.05 | 0.0001 | 0.2703 | 5 | 85 | 0.02 |
| Sample 5 | 8 | 5 | 1.50 | 9 | 9 | 2 | 0.0085 | 0.02 | 0.00001 | 0.1176 | 7 | 81 | 0.005 |
| Sample 6 | 5 | 17 | 1.70 | 900 | 900 | 5 | 0.0057 | 0.28 | 0.00005 | 0.8772 | 4 | 77 | 0.003 |
| Sample 7 | 6 | 20 | 2.05 | 4500 | 4500 | 28 | 0.0015 | 0.40 | 0.00002 | 1.3333 | 4 | 79 | 0.0009 |
| Sample 8 | 6 | 21 | 2.10 | 7500 | 7500 | 32 | 0.0003 | 0.95 | 0.00001 | 3.3333 | 5 | 75 | 0.0002 |
| Sample 9 | 5 | 23 | 2.10 | 13000 | 13000 | 35 | 0.008 | 0.025 | 0.00005 | 0.625 | — | 33 | 0.004 |
| Sample 10 | 5 | 30 | 2.20 | 450000 | 450000 | 40 | 0.095 | 1.10 | 0.0008 | 0.8421 | — | 25 | 0.05 |

For example, the nitrogen content of the crystal in Sample 1 was measured by ESR to be 0.098 ppm. The boron content of the crystal analyzed by SIMS was 0.0008 ppm, and the $^{13}C$ content of the crystal analyzed by SIMS was 0.03%. The NV center content of the crystal measured by ESR was 0.05 ppm. A Raman spectrum was measured with the double monochromator Raman spectrometer with a resolution of 0.5 $cm^{-1}$, and the half-width at 1332 $cm^{-1}$ was found to be 1.55 $cm^{-1}$. A polarized light transmission image of the diamond was observed with a polarized light transmission microscope. As a result of evaluating distortion, the average of the phase difference was 1 nm/mm. Using synthetic diamond crystal (004) planes as a first crystal arranged in parallel, the half-width of an X-ray diffraction rocking curve measured by the double-crystal method with CuKα was measured to be 5 seconds. Furthermore, when defects in the crystal were observed in an X-ray topograph, the number of linear dislocation defects was 7/$cm^{-1}$. Next, the same diamond is put into a $KNO_3$ molten salt (600° C. to 700° C.) for 1 hour, and the number of etch pits in a dense portion of etch pits was 7/$cm^2$.

As the values of "Size", "FWHM of Xrc", "Raman half-width", "Etch-pit density", "Number of defects", and "Average phase difference" of the single-crystal diamond decrease, the influence of disturbance on NV decreases, and a memory member including the single-crystal diamond therefore has improved performance. As "Cutout size" or "Single sector" of the single-crystal diamond increases, the amount of single crystal that can be used for a memory member increases, and the productivity is improved.

Although the embodiments and examples of the present disclosure have been described above, appropriate combinations and various modifications of the constituents of the embodiments and examples are also originally envisaged.

It is to be understood that the embodiments and examples disclosed above are illustrated by way of example and not by way of limitation in all respects. The scope of the present invention is defined by the appended claims rather than by the embodiments and examples described above. All modifications that fall within the scope of the claims and the equivalents thereof are therefore intended to be embraced by the claims.

REFERENCE SIGNS LIST

21, 31 single-crystal diamond
22, 32*a*, 32*b*, 55 diamond seed substrate
5 abrasive seed crystal
10 sample chamber
24*a*, 34*a* first sector
24*b*, 34*b* second sector
51 single-crystal diamond
52 insulator
53 carbon source
54 solvent metal
56 pressure medium
57 graphite heater
100 NV center

The invention claimed is:

1. A single-crystal diamond having an X-ray diffraction rocking curve with a half-width of 20 seconds or less, wherein the half-width of the X-ray diffraction rocking curve is measured with CuKα radiation in a (004) plane parallel arrangement using a diamond crystal as a first crystal in X-ray diffraction by a double-crystal method, a peak at a Raman shift in the range of 1332 $cm^{-1}$ to 1333 $cm^{-1}$ in a Raman spectrum has a half-width of 2.0 $cm^{-1}$ or less, the single-crystal diamond has an etch-pit density of 10,000/$cm^2$ or less, the etch-pit density is measured in an etching test, the single-crystal diamond has a nitrogen content in the range of 0.0001 ppm to 0.1 ppm based on the number of atoms, and the single-crystal diamond has a $^{13}C$ content in the range of 0.01% to 1.0% based on the number of atoms.

2. The single-crystal diamond according to claim 1, wherein the half-width of the X-ray diffraction rocking curve is 10 seconds or less, a peak at a Raman shift in the range of 1332 $cm^{-1}$ to 1333 $cm^{-1}$ in the Raman spectrum has a half-width of 1.9 $cm^{-1}$ or less, the etch-pit density is 1000/$cm^2$ or less, and the number of defects identified in an X-ray topographic image is 1000/$cm^2$ or less.

3. The single-crystal diamond according to claim 1, wherein the single-crystal diamond has an average of a phase difference per unit thickness of 30 nm/mm or less.

4. The single-crystal diamond according to claim 3, wherein the average of the phase difference is 10 nm/mm or less.

5. The single-crystal diamond according to claim 1, wherein the single-crystal diamond has a NV center and has a NV center content of 0.1 ppm or less.

6. The single-crystal diamond according to claim 5, wherein the NV center content ranges from 0.00001 ppm to 0.1 ppm.

7. The single-crystal diamond according to claim 1, wherein the single-crystal diamond has a boron content based on the number of atoms equal to or lower than the nitrogen content based on the number of atoms.

8. The single-crystal diamond according to claim 7, wherein the boron content based on the number of atoms is 10% or less of the nitrogen content based on the number of atoms.

9. The single-crystal diamond according to claim 7, wherein the boron content based on the number of atoms is more than 10% of the nitrogen content based on the number of atoms and is equal to or lower than the nitrogen content based on the number of atoms.

10. The single-crystal diamond according to claim 7, wherein the boron content based on the number of atoms ranges from 1% to 10% of the nitrogen content based on the number of atoms.

11. The single-crystal diamond according to claim 1, wherein a main surface of the single-crystal diamond has an inscribed circle diameter of 3 mm or more.

12. The single-crystal diamond according to claim 11, wherein the diameter is 5 mm or more.

13. The single-crystal diamond according to claim 1, wherein the single-crystal diamond has a single sector content of 70% by volume or more.

14. The single-crystal diamond according to claim 13, wherein the single sector content is 90% by volume or more.

15. A method of manufacturing the single-crystal diamond according to claim 1, the method comprising:

preparing a seed substrate; and growing a single-crystal diamond on the seed substrate by a high-temperature high-pressure synthesis method, wherein a main surface of the seed substrate has an inscribed circle diameter of more than 1.0 mm, the main surface has an etch-pit density of $1\times10^5/cm^2$ or less, and the main surface of the seed substrate has two or less growth sectors.

* * * * *